United States Patent [19]

Piole

[11] Patent Number: 4,739,251
[45] Date of Patent: Apr. 19, 1988

[54] ANALYSIS CIRCUIT FOR AN AMPLITUDE-MODULATED ELECTRIC SIGNAL COMPRISING A FREQUENCY TRANSPOSER

[75] Inventor: Philippe Piole, Rennes, France

[73] Assignee: Telediffusion De France and Etat Francais, Paris, France

[21] Appl. No.: 56,665

[22] Filed: Jun. 2, 1987

[30] Foreign Application Priority Data

Jun. 6, 1986 [FR] France .................. 86 08204

[51] Int. Cl.⁴ .................................................. G01R 23/16
[52] U.S. Cl. .................................. 324/77 R; 455/115; 455/226
[58] Field of Search ............... 324/77 R, 77 D, 77 E, 324/78 R, 78 F, 78 Z, 79 R, 79 D; 325/67; 455/37, 41, 115, 205, 260

[56] References Cited

U.S. PATENT DOCUMENTS

| | | | |
|---|---|---|---|
| 3,300,722 | 1/1967 | Hzuka | 325/67 |
| 3,548,310 | 12/1970 | Fenwick | 325/67 |
| 3,866,124 | 2/1975 | Wycoff | 455/37 |
| 3,876,953 | 4/1975 | Abel | 455/205 |
| 4,006,315 | 2/1977 | Halstead | 455/41 |
| 4,241,454 | 12/1980 | Snell | 455/260 |
| 4,244,054 | 1/1981 | Lorea | 455/115 |

*Primary Examiner*—Michael J. Tokar
*Attorney, Agent, or Firm*—Stevens, Davis, Miller & Mosher

[57] ABSTRACT

Circuit for analyzing an amplitude-modulated electric signal. This circuit comprises a quartz oscillator operating at a frequency fq, a frequency transposer making it possible to transpose the spectrum of the incident signal about fq, a narrow filter centered on one of the side bands, a detector receiving said side band and the reference signal at frequency fq and two processing channels, one being an amplitude channel and the other a phase channel.

Application of the measurement of the current in an antenna, to the characteristics of quadripoles, impedances, etc.

2 Claims, 3 Drawing Sheets

ANALYSIS CIRCUIT FOR AN AMPLITUDE-MODULATED ELECTRIC SIGNAL COMPRISING A FREQUENCY TRANSPOSER

BACKGROUND OF THE INVENTION

The present invention relates to an analysis circuit for an amplitude-modulated electric signal comprising a frequency transposer.

The invention has numerous applications, particularly in the measurement of the distribution of the current along an antenna by the so-called modulated return radiation method, in the measurement of the radiated pattern or transmission diagram of an antenna and in more general terms, in ultra-high frequency measurements (analyser of networks, impedances, etc).

In order to give the principles of the invention, use will be made of the example of measuring the distribution of the current along an antenna by the modulated return radiation method, without this example being in any way limitative for the scope of the invention. The attached FIG. 1 illustrates this method.

An antenna 1 is supplied by a generator 2 across a circulator 3 (or hybrid T or coupler), generator 2 operates at a frequency fo. A small probe 4, formed from a conductive coil closed on a photoresistor, is moved along the antenna. The photoresistor of the probe is illuminated by light radiation guided by an optical fibre 5 supplied by a light-emitting diode 6. The latter is controlled by a circuit 7 comprising an oscillator operating at frequency fm. The amplitude-moldulated light radiation at frequency fm causes a variation in the resistance of the photoresistor inserted in the probe. The probe interacts with the antenna, in such a way that the electric signal reflected by the antenna is also amplitude modulated at frequency fm.

Thus, the signal supplied by circuit 3 is in form $U(1+m\cos w_m t)\cos(w_o t+\phi)$, in which U is an amplitude, which can be shown to be proportional to the square of the current flowing in the antenna at the location of the probe, in which $w_o$ is the pulsation $2\pi fo$, is a phase in which $m\cos w_m t$ characterises the amplitude modulation at pulsation $w_m = 2\pi fm$. This expression is valid, to within an interferring voltage due to leaks and mismatching of the system and which will be ignored hereinafter.

The spectrum of such a signal is formed by a carrier at frequency fo and two side bands at frequencies fo−fm and fo+fm. Such a signal carries amplitude and phase informations relative to the current flowing in the antenna to the right of the probe.

Such a method is e.g. described in the article by K. Itzuka entitled "photoconductive probe for measuring electromagnetic fields", published in IEE proceedings, vol 110, No. 10, October 1963.

The invention relates to a circuit able to analyze such a signal constituted by a carrier and two side bands. It carries the reference 100 in FIG. 1 and comprises a signal input 102 and an auxiliary input 104 for receiving part of the signal at frequency fm used for modulating the diode. The circuit according to the invention gives the amplitude and phase of the current circulating in the antenna and more generally of the high or ultra-high frequency signal which is to be analysed.

In order to process such a signal, the prior art has generally used a synchronous detection method. However, this method suffers from disadvantages, particularly with respect to the difficulty of obtaining a stable local isolator and providing a phase locked loop.

SUMMARY OF THE INVENTION

The object of the present invention is to obviate these disadvantages whilst also providing a greater fineness of the analysis band, because the latter only has a width of a few cycles. Moreover, the circuit according to the invention is automatic, in the sense that it requires no external regulation and this applying within a very wide frequency range between 10 and 2000 MHz and higher. Moreover, the sensitivity of the circuit according to the invention exceeds that of the prior art circuits by approximately 60 dB. This sensitivity improvement makes it possible to lower the level of the measuring generator (2 in FIG. 1), which protects the measuring equipment, whilst at the same time reducing interference to the outside.

Finally, the circuit according to the invention constitutes a basic circuit for numerous applications and for widely varying frequencies. Thus, if the frequency of the signal to be processed is not in the range for which the circuit has been designed, it is merely necessary to carry out a frequency conversion in order to bring it into the range in question. Thus, it has been possible to successfully carry out measurements at 12 GHz.

All these objectives are achieved by the invention through the realisation of a frequency transposing circuit. To this end, a quartz oscillator supplies a signal at a frequency fq and a frequency transposing circuit transforms the signal constituted by the carrier at fo and two side bands at fo−fm and fo+fm into a signal with a carrier fq and two side bands at fq−fm and fq+fm. The values of these various frequencies are also chosen so that one of these side bands coincides with the centre frequency of a very narrow crystal filter (e.g. of width 200 Hz). This filter then only leaves one of the side bands, e.g. the lower band at fq−fm. The signal corresponding to said band carries the informations relative to the sought amplitude and phase. By a detection using the signal at frequency fq transmitted by the quartz oscillator, a signal at frequency fm is restored and from it are extracted the amplitude and phase informations in question.

The operation of the circuit is independent of the value of the carrier frequency fo, which can therefore be in a wide range, e.g. between 2 and 2000 MHz.

For example, the frequency fm can be approximately 500 Hz, the frequency fq 9000.5 kHz, so that the lower side band fq−fm is at 9000 kHz, i.e. the centre frequency of the filter, which can have a pass band of 200 Hz. After detection, a final filtering can take place at 500 Hz with a pass band of 5 Hz. On the basis of a quartz oscillator operating at 2 MHz with a divider by 4096, a frequency of 488 Hz will be obtained for fm.

BRIEF DESCRIPTION OF THE DRAWINGS

The invention is described in greater detail hereinafter relative to non-limitative embodiments and the attached drawings, wherein show.

BRIEF DESCRIPTION OF THE PREFERRED EMBODIMENTS

Figure 1:
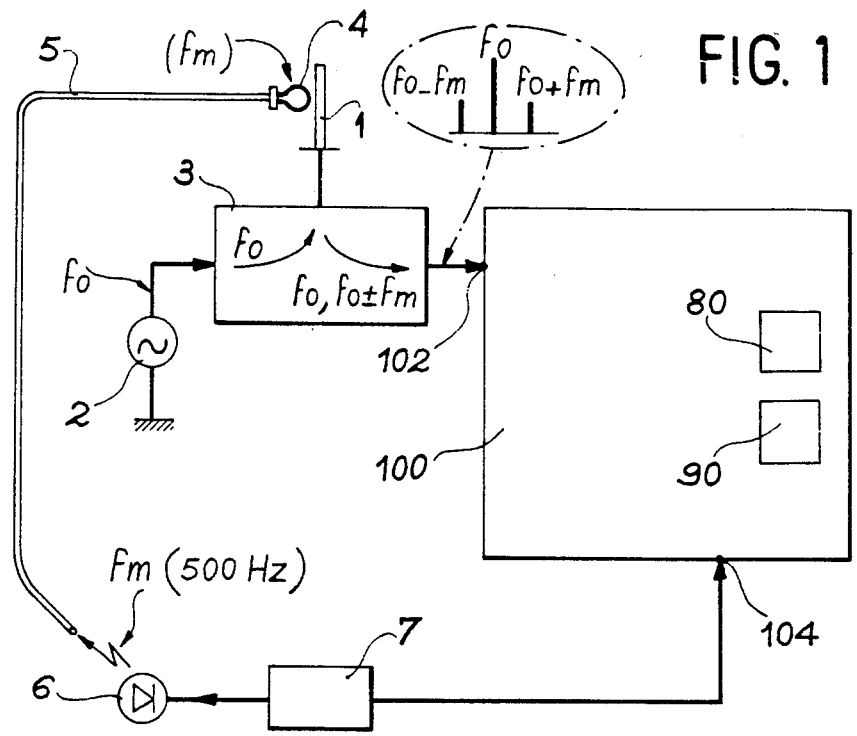
FIG. 1 already described, an application example for the circuit according to the invention.
Figure 2:
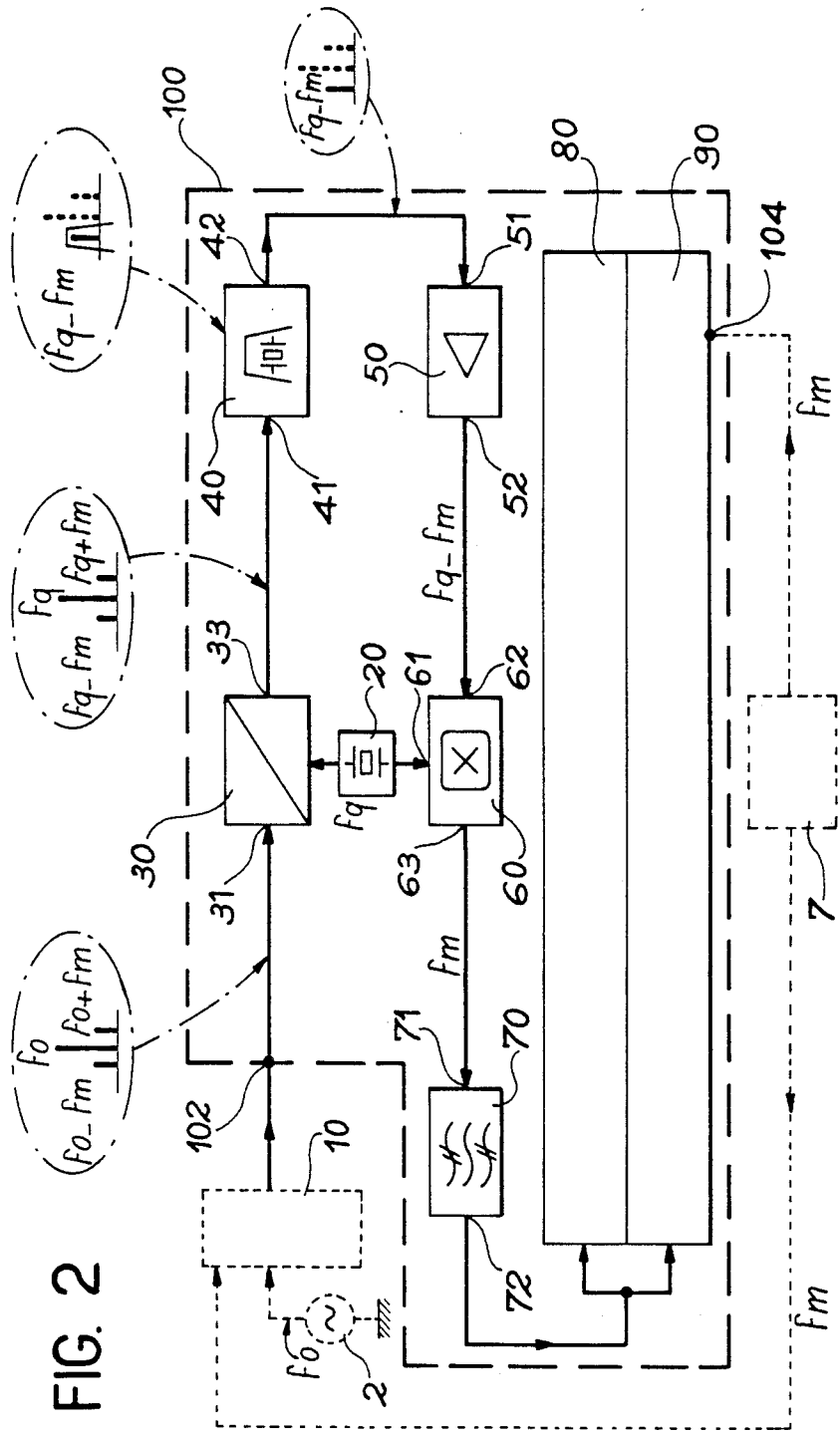
FIG. 2, the block diagram of the inventive circuit.

The assembly shown in FIG. 2 essentially comprises circuit 100 according to the invention. This circuit is supplied by a system 10, which is not shown in detail and which can be of a random nature, its function being to receive a signal at frequency fo (produced by a generator 2) and a signal at frequency fm (produced by a generator 7). In the case of the application to the measurement of the current in an antenna and as is illustrated in FIG. 1, circuit 10 will be constituted by a coupler 3, an antenna 1 and a probe 4. However, other arrangements are possible, as will be shown hereinafter, the essence being to obtain at the output of system 10, a signal constituted by a carrier at frequency fo with two side bands at fo−fm and fo+fm. This signal is then applied to input 102 of circuit 100 for processing.

As shown, circuit 100 comprises:
- a general input 102 receiving the amplitude-modulated signal;
- a quartz oscillator 20 supplying a signal at a frequency fq;
- a frequency transposing circuit 30 having a first input 31 connected to the general input 102 and a second input 32 connected to oscillator 20, said circuit supplying on an output 33 a signal corresponding to a carrier at frequency fq with two side bands at frequencies fq−fm and fq+fm;
- a band pass-type crystal filter 40, centered on the frequency of one of the side bands fq−fm or fq+fm and with a very narrow pass band (e.g. 200 Hz), said filter cutting the carrier fq and the other side band, having an input 41 connected to the output of transposer 30 and an output 42 supplying the filtered side band, e.g. at frequency fq−fm;
- an amplifier 50 having an input 51 connected to the band pass filter 40 and an output 52, said filter e.g. having a gain of 45 dB;
- a product detector 60 having a first input 61 connected to oscillator 20 and receiving a signal at frequency fq, a second input 62 connected to the output of amplifier 50 and receiving a signal at the frequency of the filtered side band (fq−fm in the aforementioned example), said detector having an output 63 supplying a signal at frequency fm;
- a band pass filter 70 centered on the frequency fm (in the aforementioned example centered at 500 Hz) and with a narrow pass band of approximately 5 Hz, said filter having an input 71 connected to the output 63 of detector 60 and an output 72;
- a first processing channel 80 connected to output 72 of the narrow band pass filter 70 and able to supply a signal which is a function of the amplitude of the signal supplied by filter 70;
- a second processing channel 90 connected to output 72 of the narrow band pass filter 70 and able to supply a signal which is a function of the phase of the signal supplied by filter 70, said second channel also having an auxiliary input 104 for the introduction of part of the signal of frequency fm used for the amplitude modulation of carrier fo.

The operation of this circuit is readily apparent from what has been stated hereinbefore. Frequency transposition takes place on fq, followed by the filtering of one of the side bands and finally the restoration of the modulation frequency fm.

Figure 3:
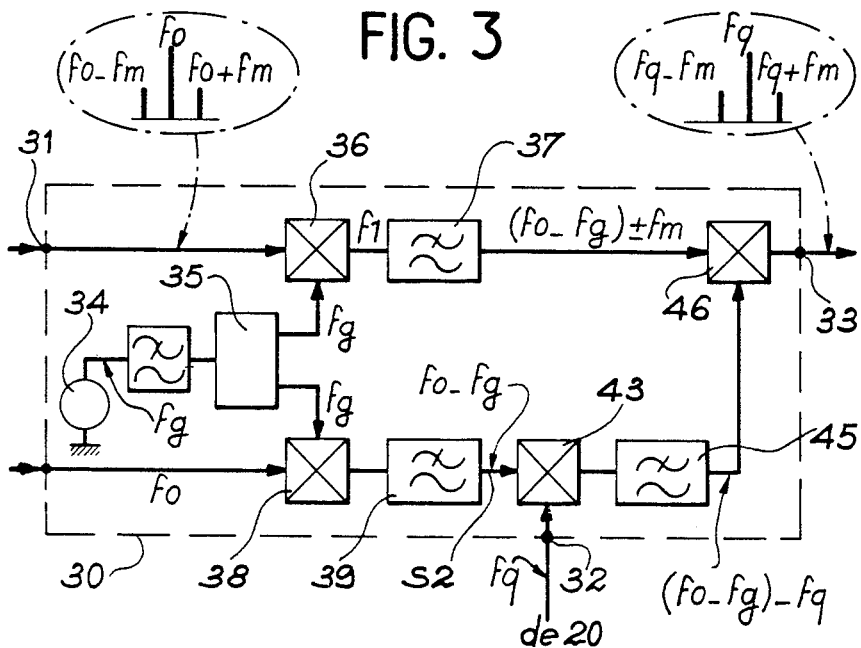
FIG. 3, an embodiment of a frequency transposer.
Figure 4:
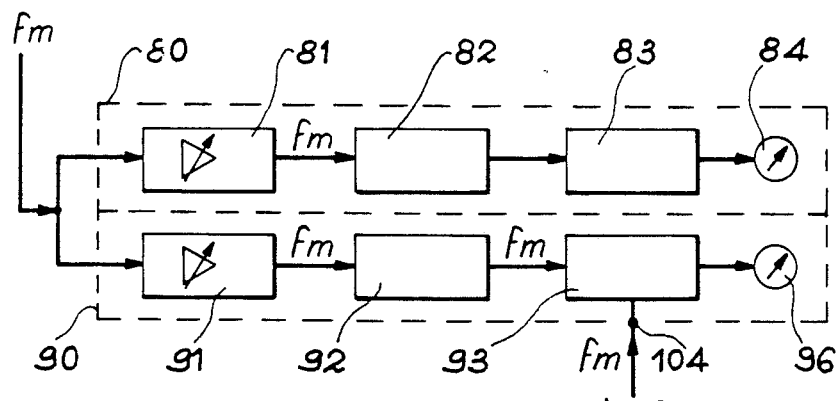
FIG. 4, an embodiment of the two processing channels for the amplitude and phase, in the case of measuring the current in an antenna by the modulated return radiation method.

Embodiments of circuits 38 and 90 are illustrated in FIGS. 3 and 4.

The circuit shown in FIG. 3 firstly corresponds to the frequency transposer 30 and, as shown, comprises: an oscillator 34 supplying a signal at a frequency fg, the value of fg differing from the value fo by a quantity less than fq, which means that in practice fg is between fo−9 MHz and fo+9 MHz (on choosing fq as 9 MHz);
- a divider 35 with an input connected to the oscillator 34 and first and second outputs, each of which supplies signals at frequency fg;
- a first mixer 36 having a first input connected to the input 31 of the transposer circuit and receiving the signal constituted by the carrier at frequency fo and two side bands at fo−fm and fo+fm and with a second input connected to the first output of divider 35 and receiving a signal at frequency fg, said first mixer having an output, which supplies a signal having two carriers of frequency equal to fo+fg and fo−fg and their side bands;
- a first low pass filter 37 having a cut-off frequency equal to fq and supplying a first filtered signal modulated in amplitude with a carrier at frequency fo−fg;
- a second mixer 38 having a first input receiving the signal at frequency fo and a second input connected to the second output of divider 35 and receiving a signal at frequency fg, said second mixer supplying a signal with two frequencies equal to fo+fg and fo−fg;
- a second low pass filter 39 having a cut-off frequency equal to fg and supplying a second signal filtered at frequency fo−fg;
- a third mixer 43 having a first input connected to the second low pass filter 39 and receiving the second signal filtered at frequency fo−fg and a second input connected to the second input 32 of transposer circuit 30 and receiving the signal from quartz oscillator 20 at frequency fq and an output supplying a signal at frequencies fq±(fo−fg);
- a third low pass filter 45 having a cut-off frequency equal to fq, said filter being connected to the third mixer 43 and supplying a third signal equal to frequency (fo−fg)−fq;
- a fourth mixer 46 with a first input connected to the first low pass filter 37 and receiving the first signal modulated in amplitude with a carrier at frequency fo−fg and a second input connected to the third low pass filter 45 and receiving the third signal at frequency (fo−fg)−fq and an output 33 supplying a signal constituted by a carrier at frequency fq and two side bands at frequencies fq−fm and fq+fm.

The operation of the circuit of FIG. 3 results from what has been stated hereinbefore. Using a system at intermediate frequency fg and through the use of mixers and filters, it is a question of transposing the incident signal, which contains the carrier at fo and its two side bands at fo−fm and fo+fm on a signal having a carrier at fq and two side bands at fq−fm and fq+fm. This is brought about by starting with the signal at frequency fo used for exciting the antenna and said signal is mixed with a signal at an intermediate frequency fg between fo−9 MHz and fo+9 MHz, the value 9 MHz being that of the frequency fq (to within 0.0005 MHz). However, this value is arbitrary.

At the output of mixers 36 to 38 there is a measuring signal at frequency fo−fg between 0 and 9 MHz and a signal at frequency fo+fg, which is eliminated by low pass filters 37 and 39.

Thus, at the output of filter 37, to within a term due to leaks and mismatchings, there is a signal of form:

$$S1 = U(1 + m\cos w_m t)\cos(w_1 t + \phi)$$

with U being the voltage proportional to the square of the current to be measured in the antenna and m the modulation depth, $w_m$:2nfm, $w_1$: 2nf$_1$ in which $$f_1 = fo - fg.$$

Mixer 38 and filter 39 constitute a reference channel, which supplies a signal at frequency $f_1 = fo - fg$.

Mixer 43 receives this signal with the signal at frequency fq=9000.5 KHz. The resulting signal has a spectrum with two frequencies at f$_1$±fq and only the lower beat is used by filter 45.

The double mixer 46 combines the latter signal with the signal filtered by 37. The two signals have a carrier respectively at (fo−fg) and (fo−fg0−fq, so that there is a beat at fq. However, the first carrier is associated with side bands spaced by ±fm. Thus, finally a carrier at fq is obtained having two side bands at fq−fm and fq+fm.

If fq is = to 9000.5 kHz and fm to 0.5 kHz, the lower side band is at 9000 kHz, which is the centre frequency of the filter (40 in FIG. 2). The upper side band is 9001 kHz. As filter 40 has a very small band width of approximately 200 Hz, the upper side band is well outside the range of the filter and carrier fq.

FIG. 4 gives an embodiment of channels 80 and 90 making it possible to extract the amplitude and phase informations. The channels receive the signal at frequency fm (500 Hz in the example), said signal coming from output 72 of filter 70 shown in FIG. 2.

Channel 80 firstly comprises an amplifier 81, e.g. of 40 dB, then a first analog circuit 82, which gives the effective value of the signal and a second analog circuit 83, which extracts the square root from the previously obtained effective value. The result is displayed on the measuring apparatus 84, which finally gives the amplitude of the current flowing in the antenna to the right of the probe.

Channel 90 firstly comprises an amplifier 91, e.g. with automatic gain control (of approximately 80 dB), a shaping circuit 92 and a phase comparator 93. This circuit receives the signal at frequency fm from the preceding circuits, but also by an auxiliary input 104 the reference signal, which is also at frequency fm and which comes from oscillator 7 used for modulating the probe. This comparator supplies an information which is displayed on apparatus 96. The apparatus can be calibrated in such a way that the measured half-phase is displayed because, in the measurement of the current flowing in an antenna, it is possible to demonstrate that the phase of this current is in fact half the phase obtained following circuit 93.

In what has been stated hereinbefore, it has been considered in exemplified manner that the lower side band at fq−fm was filtered. However, it is also possible to work with the upper band at fq+fm, whilst retaining a filter 40 operating at the same frequency, i.e. 9000 kHz in the considered example. For this purpose, it is necessary to take fq as equal to 8999.5 kHz. Thus, the upper band falls exactly within the band of the filter.

Figure 5:
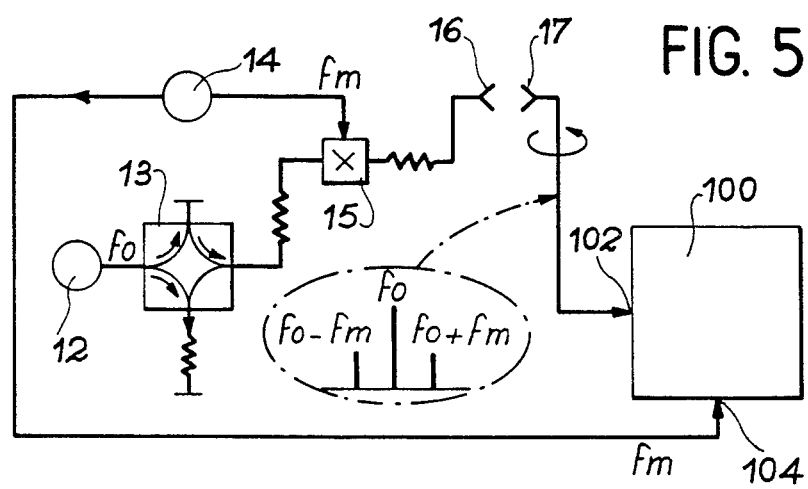
FIG. 5, another application of the invention relating to the plotting of the radiation pattern or transmission diagram of an antenna.

FIG. 5 shows another example of realising the circuit according to the invention. It is a question of measuring the radiation pattern or transmission diagram of an antenna. The installation shown comprises a generator 12 operating at frequency fo, a matched coupler 13, an oscillator 14 operating at frequency fm and a modulator 15 making it possible to supply the illuminating antenna 16 by a signal at frequency fo amplitude modulated by a signal at frequency fm. The antenna 17 to be studied intercepts the electromagnetic field transmitted by the antenna 16. This field trapped by the antenna 17 as a function of its angular position defines the radiation pattern in both amplitude and phase.

The signal collected is constituted by a carrier at frequency fo and two side bands at fo−fm and fo+fm, so that the signal considered hereinbefore is obtained. This signal is applied to input 102 of circuit 100 according to the invention, which also receives at its auxiliary input 104, a reference signal at frequency fm from oscillator 14.

In this application, it is no longer necessary to extract the square root from the effective value to obtain the sought amplitude, as in the measurement of the current in an antenna. Thus, circuit 83 disappears in the processing circuit. In the same way, the phase obtained is no longer twice the sought phase, as in the preceding application and is instead the actual phase. The calibration of the measuring apparatus 96 is consequently immediate.

The selectivity of the circuit according to the invention is very great (approximately 5 Hz), so that it is easily possible to overcome any interference which may be present in the antenna field. If a spurious signal appears, it is merely necessary to slightly displace the analysis window, i.e. the transmission or emission frequency by a few cycles or the frequency fg. the circuit according to the invention consequently enables measurments to be carried in a polluted medium of the amplitude and the phase of the radiation emitted by an antenna.

Figure 6:
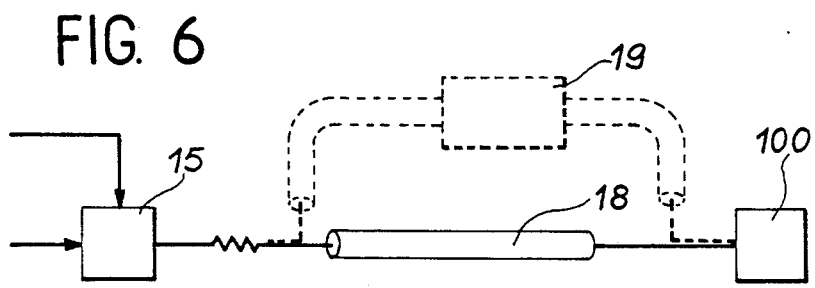
FIG. 6, another application relating to a vector analyser.

The circuit according to the invention can also be used as a vector analyser. in FIG. 6, antenna 16 and probe 17 are replaced by a cable 18, which can be firstly directly connected to circuit 100 for calibration and then to a quadripole 19 to be tested, whose output is connected to circuit 100. The circuit according to the invention then behaves as a very selective vector voltmeter and permits a fine analysis of the characteristics of a quadripole.

It is also possible to measure a complex reflection coefficient from an impedance to be tested.

It is also possible to measure a current flowing in an antenna, the current sampled by the probe being measured instead of modulating the current injected into the antenna. This probe is not necessarily a loop, but can be constituted by any sensor (point, contact, magnetic, electric sensor, etc).

Various auxiliary circuits can be added to those described hereinbefore and in particular to those of FIGS. 2 and 3. It is possible to use a calibrated attenuator at the input of the channel operating at 9 MHz. It is also possible to add a voltage - frequency converter after the effective value detector 82, in order to provide a sound indication of the amplitude, so that the operator can easily position the nodes and antinodes of the current along the antenna. It is also possible to use a coupler and a detector at the output of hybrid circuit 3 (FIG. 1) for monitoring the level of the return a wave and optionally trigger an alarm.

What is claimed is:

1. A circuit for analysing an electric signal constituted by a carrier of frequency fo modulated in amplitude by a frequency fm, said circuit comprising:
    a general input receiving the amplitude-modulated signal;
    a quartz oscillator supplying a signal at a frequency fq;
    a frequency transposing circuit having a first input connected to the general input and a second input connected to the oscillator, said circuit supplying on an output a signal corresponding to a carrier at frequency fq with two side bands at frequencies fq−fm and fq+fm;
    a very narrow band pass-type crystal filter centered on the frequency of one of the side bands fq−fm or fq+fm and cutting the carrier at frequency fq and the other side band, said filter having an input connected to the output of the transposer and an output supplying the filtered side band;
    an amplifier having an output connected to the band pass filter and an output;
    a product detector having a first input connected to the oscillator and receiving a signal at frequency fq, a second input connected to the output of the amplifier and receiving a signal at frequency fq+fm or fq−fm, said detector having an output supplying a signal at frequency fm;
    a narrow band pass filter centered on frequency fm having an input connected to the output of the detector and an output;
    a first processing channel connected to the output of the narrow band pass filter and able to supply a signal which is a function of the amplitude of the signal supplied by the filter;
    a second processing channel connected to the output of the narrow band pass filter and able to supply a signal which is a function of the phase of the signal supplied by the filter, said channel having an auxiliary input for the introduction of part of the signal which has been used for the amplitude modulation of the carrier.

2. A circuit according to claim 1, wherein the frequency transposing circuit comprises:
    an oscillator supplying a signal at a frequency fg, the value of fg differing from the value fo by a quantity less than fq;
    a divider having an input connected to the oscillator and first and second outputs each supplying signals at frequency fg;
    a first mixer having a first input connected to the input of the transposer circuit and receiving the signal at frequency fo modulated in amplitude and a second input connected to the first output of the divider and receiving a signal at frequency fg, said first mixer having an output;
    a first low pass filter having a cut-off frequency equal to fq, said filter being connected to the output of the first mixer and supplying a first filtered signal constituted by a carrier at frequency fo−fg and its side bands;
    a second mixer having a first input receiving the signal at frequency fo and a second input connected to the second output of the divider and receiving a signal at frequency fg and supplying a signal at a frequency equal to fo±fg;
    a second low pass filter having a cut-off frequency equal to fq and supplying a second signal filtered at frequency fo−fg;
    a third mixer having a first input connected to the second low pass filter and receiving the second signal filtered at frequency fo−fg and a second input connected to the second input of the transposer circuit and receiving the signal from the quartz oscillator at frequency fg and an output supplying a signal at frequencies fq±(fo−fg);
    a third low pass filter having a cut-off frequency fq and connected to the third mixer and supplying a third signal at frequency (fo−fg) fq;
    a fourth mixer with a first input connected to the first low pass filter and receiving the first amplitude-modulated signal with a carrier at frequency fo−fg and a second input connected to the third low pass filter and receiving the third signal at frequency fq−(fo−fg) and an output supplying a signal constituted by a carrier at frequency fq and the two side bands at frequencies fq−fm and fq+fm.

* * * * *